United States Patent [19] [11] 4,118,230
Binder [45] Oct. 3, 1978

[54] PROCESS FOR ADJUSTING EXPOSURE MASKS RELATIVE TO A SUBSTRATE WAFER

[75] Inventor: Hans Binder, Unterpfaffenhofen, Germany

[73] Assignee: Siemens Aktiengesellschaft, Berlin & Munich, Germany

[21] Appl. No.: 835,746

[22] Filed: Sep. 22, 1977

[30] Foreign Application Priority Data

Sep. 22, 1976 [DE] Fed. Rep. of Germany ....... 2642634

[51] Int. Cl.$^2$ .......................... G03C 5/04; G03C 5/00
[52] U.S. Cl. ...................................... 96/27 R; 96/36; 96/38.3; 156/661
[58] Field of Search ............... 96/27 R, 36, 36.2, 38.3, 96/DIG. 27; 156/661; 427/8

[56] References Cited

U.S. PATENT DOCUMENTS

| | | | |
|---|---|---|---|
| 3,477,848 | 11/1969 | Pritchard | 96/38.3 X |
| 3,506,442 | 4/1970 | Kerwin | 96/27 R X |
| 3,607,267 | 9/1971 | Garrels | 96/27 R |
| 3,690,881 | 9/1972 | King | 96/27 R |
| 3,963,489 | 6/1976 | Cho | 96/38.3 X |
| 4,060,643 | 11/1977 | Blanks | 96/27 R X |

*Primary Examiner*—Edward C. Kimlin
*Attorney, Agent, or Firm*—Hill, Gross, Simpson, Van Santen, Steadman, Chiara & Simpson

[57] ABSTRACT

An improved process for adjusting different exposure masks consecutively relative to a substrate wafer by providing individual pairs of adjustment marks on the substrate with each pair being associated with a selected exposure mask and the number of pairs on the substrate being equal to the number of exposure masks minus one, to be utilized. Preferably, the marks of the pairs are aligned in rows with the first mark of each pair being in the first row and the second mark of each pair being in the second row.

6 Claims, 18 Drawing Figures

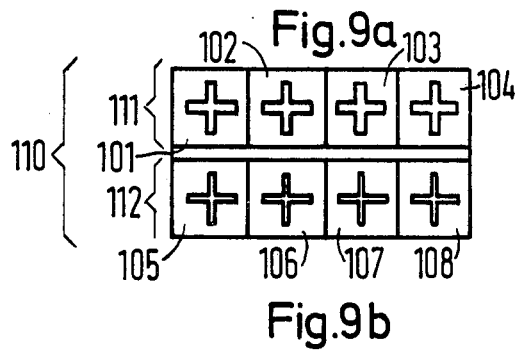
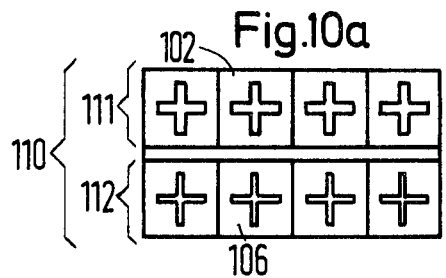
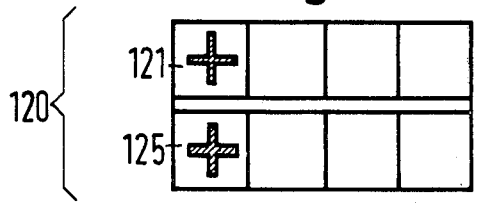
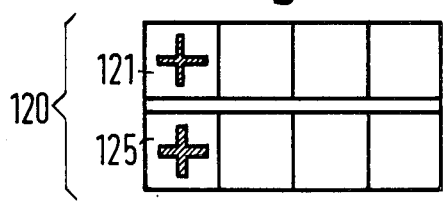
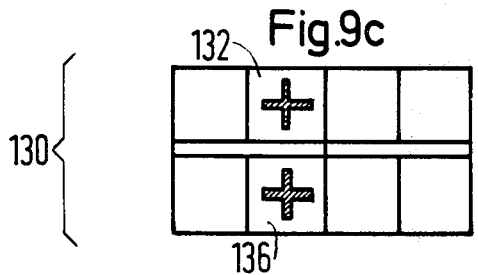
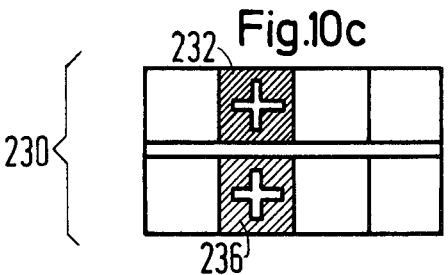
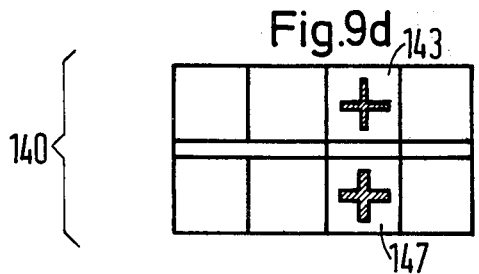
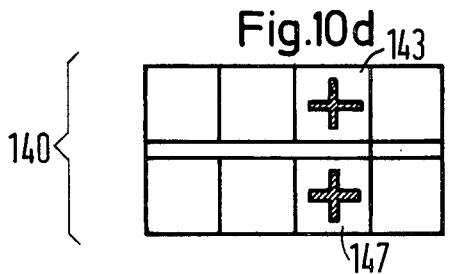
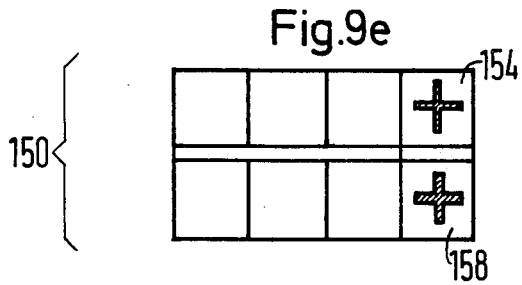
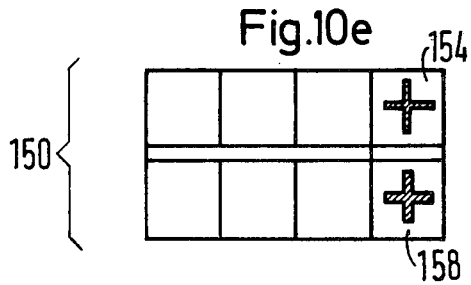

PROCESS FOR ADJUSTING EXPOSURE MASKS RELATIVE TO A SUBSTRATE WAFER

BACKGROUND OF THE INVENTION

Field of the Invention

The present invention is directed to a process for adjusting exposure masks to perform consecutive photolithographic processes on a substrate.

Prior Art

Semiconductor components and integrated circuits, which have a plurality of layers such as insulating layers and conductive path layers disposed on the semiconductor substrate, are provided with the individual layers by individual photolithographic processes. In particular during the production of integrated circuits in which the individual components possess a size in the order of a few $\mu$m, it is necessary that each of the photolithographic structures which is being produced on the substrate should be positioned extremely accurately relative to the previously formed structures. This will require that the photo mask emloyed in the consecutive photolithographic processing steps be adjusted extremely accurately onto the substrate wafer.

The adjustment of the photolithographic mask is effected usually by a first photolithographic step which will form an adjustment mark from the first photo mask onto the substrate which mark, for example, will have the form of adjusting cross. The adjustment of the next following or second exposure mask is effected by utilizing the mark, which was produced during the first photolithographic process, and matching a mark on the second mask which is geometrically similar to the adjustment mark on the substrate wafer. Whether an adjustment mark on the second mask in a conventional adjustment process is larger than the mark on the substrate wafer or smaller than the mark on the substrate wafer will depend on whether the second mark is fundamentally impermeable or permeable to light. When positive photo lacquer is used, for example, in the case of a mask which is to be used for the production of individual diffusion windows in an oxide layer, this photo mask is generally impermeable to light. In such a case, the adjusting marks consist of a transparent grid cross whose dimensions are somewhat greater than the corresponding cross dimensions of the adjustment mark on the substrate wafer. In this example, the exposure of the photo resist through the second mask will cause removal of the photo resist in the area of the adjustment mark so that during subsequent etching through the etching mask produced by the second photolithographic process, the oxide layer of the substrate will be removed in the area of the adjustment mark on the substrate. When the silicon, which has been uncovered is subsequently oxidized to form a silicon dioxide layer, the dimensions of the adjustment mark in the substrate wafer will be increased to the dimensions of the cross or mark of the second exposure mask and thus the mark will increase in size relative to its original size before the second photolithographic process.

Accordingly, in a normal exployed process, the third exposure mask will be equipped with a still larger transparent cross in order that for the adjustment of the third exposure mask on the substrate, the cross contained in the substrate wafer is fully visible through the cross in third exposure mask. As a result of this fact, it is necessary in the production of a plurality of consecutive photo masks to provide adjustment marks with the smallest dimension or size in the first exposure mask used to form the adjustment mark on the substrate and that the greatest size or dimension of the mask is in the last utilized exposure mask. The same problems and procedures will also apply to adjusting marks in which different geometrical shapes are used.

Since each subsequently used exposure mask needs adjustment marks whose dimensions are slightly greater than the marks of the previously used masks, their size relationship of the marks of the masks will determine the sequence of use of the masks during a production step. A change in the sequence of use of the masks, for example using the third mask before the second mask, would require attempting to adjust and align a smaller transparent cross of the second mask on a larger adjustment mark in the substrate formed by the third mask and would lead to adjustment inaccuracies. Similar problems will also occur when the mask used adjustment marks which consist of dark lines on a transparent background. As a result of the increasing size of each of the adjustment marks, it is particularly difficult to change the sequence of the individual photolithographic processes which is often desired when utilizing experimental production processes for integrated circuits.

SUMMARY OF THE INVENTION

The present invention is directed to providing a method for adjusting of individual exposure masks relative to a substrate during photolithographic processes wherein it is possibly to modify the sequence of the mask being used without impairing the adjustment accuracy.

To accomplish this task, the present invention is directed to an improvement in a method for adjusting individual exposure masks relative to a substrate during consecutively performed photolithographic processes wherein the substrate is provided with an adjustment structure by means of a photolithographic step employing a first mask and the method includes at least two additional photolithographic processes being consecutively performed on the substrate with each process including adjusting an exposure mask on the substrate by aligning adjustment structures on each of the masks to coincide with the adjustment structure of the substrate, said process causing the dimensions of the adjustment structure of the mask to be reproduced on the adjustment structure of the substrate. The improvement comprising providing an adjustment structure for the substrate having a separate pair of adjustment marks for each of the exposure masks so that the number of pairs at least equals the number of exposure masks, providing each of the exposure masks with a single pair of adjustment marks comprising a first and second mark, said pair on one exposure mask being spatially arranged with respect to the pairs on the other exposure masks so that when each of the exposure masks are aligned on the substrate, the pair of adjustment marks of each mask is aligned to coincide with a different pair of marks on the substrate.

The adjustment structures employed by the invention are covered by a rigid system. This has the advantage that during the design stage of a circuit, no special considerations need be given to the adjustment structure such as adjustment crosses and it is not possible to confuse the individual adjustment crosses. Another advantage of the process in accordance with the present invention consists in that when the described adjustment structures are employed, the transfer copying mask prepared for a positive photo lacquer technique can also be used for a negative photo lacquer technique or a lifting technique without the need to produce new adjusting crosses. Furthermore, it is also possible to modify the sequence of the photolithographic steps or processes without re-preparing the existing exposure mask.

In a special embodiment of the process in accordance with the invention, the adjustment marks consist of adjusting crosses, which are formed in accordance with the following principles. When the bar width or dimensions of both adjusting crosses on the first mask is smaller than or greater than the dimensions of the adjustment marks on the subsequently used exposure mask, one of these adjustment marks may consist of a transparent cross on a dark background and the other consists of a nontransparent cross on a transparent background. If, on the other hand, the bar width or dimensions of one of the adjusting marks on the first mask is greater than those of the adjustment marks of the subsequently used mask, and the bar width or dimension of the other adjustment mark is smaller than the adjustment mark of the subsequently used mask, both adjusting marks of the following mask are formed as transparent crosses on a dark background or as dark crosses on a transparent background.

BRIEF DESCRIPTION OF THE DRAWINGS

FIGS. 9a–9e schematically illustrate a preferred embodiment of the process of the present invention; and FIGS. 10a–10e also schematically illustrate the method of the present invention wherein a complementary mask has been used in relation to the process illustrated in FIGS. 9a–9e.

DESCRIPTION OF THE PREFERRED EMBODIMENTS

The principles of the present invention are particularly useful when employed in a method for adjusting the position of an exposure mask on a substrate 1.

Figure 1:
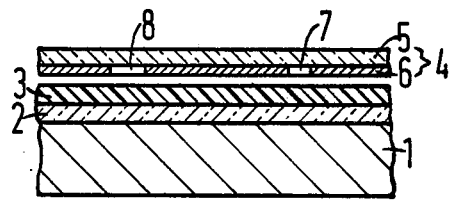
FIGS. 1–4 are cross-sectional views schematically illustrating the sequence of steps for transferring adjustment marks from a first masks photolithographically onto a substrate.
Figure 2:
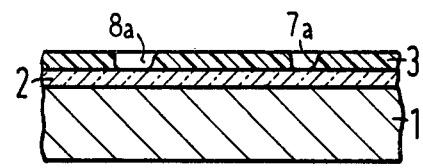
Figure 3:
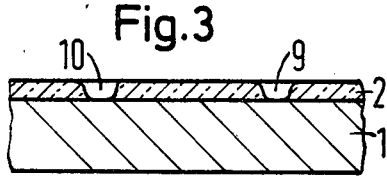
Figure 4:
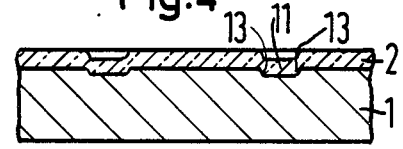
Figure 5:
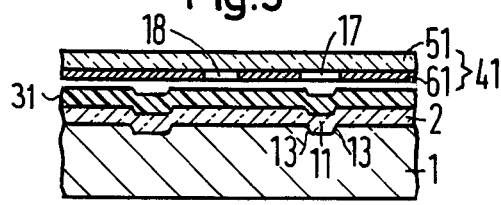
FIGS. 5–8 are cross-sectional views schematically illustrating the sequence of steps of adjusting a second mask to coincide with the alignment marks of the first mask and photolithographically forming a second structure including the changing of structure of the adjustment marks on the substrate.

As illustrated in FIG. 1, a substrate 1 such as a substrate wafer of silicon is coated with a silicon dioxide layer 2 which is covered with a layer 3 of positive photo lacquer. To provide the substrate 1 with adjustment marks and possibly with an additional structure, the method was a photo or exposure mask 4, which consists of a light permeable carrier 5 supporting a layer 6 of material which is impermeable to light. To provide a structure for the exposure mask 4, openings 7 correspond to the alignment structure and openings 8 correspond to a structure such as a diffusion window which is to be subsequently etched into the silicon dioxide layer 2. With the mask 4 positioned as illustrated in FIG. 1, the layer 3 is exposed through the mask 4 and the subsequent development will result in the formation of openings 7a and 8a (FIG. 2), which correspond to the mask openings 7 and 8. The development of the layer 3 causes the openings 7a and 8a to uncover portions of the silicon dioxide layer 2, which exposed portions will be removed during the subsequent etching step to form openings or windows 9 and 10 (FIG. 3) in the silicon dioxide layer 2. After the etching process or step, a diffusion process may be carried out so that a dopant is diffused into the silicon wafer 1 in the region of the window or opening 10. Then a silicon dioxide layer 2 is again produced on the silicon wafer by heating the substrate 1 in the presence of oxygen. During the production of the silicon dioxide layer 2 on the silicon wafer, there is thus formed recesses 11 which represents the adjustment marks and whose flanks or edges 13 are visible as lines when the adjustment is carried out under vertical lighting. If the opening 7 had a configuration of the cross, such as illustrated in FIGS. 9a and 10a, then the marks 11 would have a configuration similar to marks illustrated in FIGS. 9a and 10a.

In the remainder of the production process, an additional or second exposure or photo mask 41 is adjusted relative to the adjustment mark 11 of the substrate 1. This second exposure mask 41 consists of a light permeable carrier 51 on which a layer 61 which is impermeable to light is carried. The layer 61 will be provided with openings such as 18 for additional structure to be formed in the substrate and will contain an adjustment mark comprising an opening 17, which will have the form or shape of the adjustment mark 11 and thus have the shape of a cross. Exposure mask 41 is moved or adjusted on the substrate 1 so that the adjustment mark 17 will be aligned to coincide with the adjustment mark 11 whose edges or flanks 13 are visible under vertical light as lines. As illustrated, the mark 17 is larger than the mark 11 so that the entire mark 11 will be visible through the adjustment mark 17.

Figure 6:
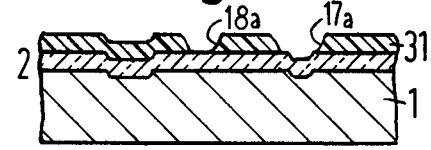
Figure 7:
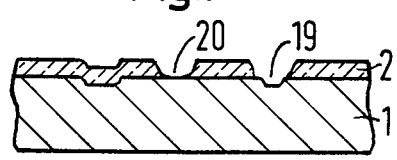
Figure 8:
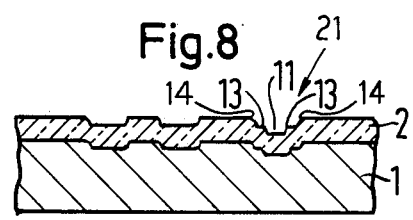

The silicon dioxide layer 2 of the substrate 1 was provided with a second photo lacquer layer 31, which also is a positive photo lacquer. Thus, exposure through the second mask 41 with a subsequent development will cause the second layer 31 to have openings 17a and 18a that expose portions of the silicon dioxide layer 2 (FIG. 6). After exposing and developing the layer 31, the silicon dioxide layer 2 is etched with the portions exposed by the openings 18a being removed to form a window 20 and the portion exposed by the opening 17a causing a reproduction 19 of the adjustment mark 17 of the second mask 41. When the silicon dioxide wafer is again re-oxidized, a structure as illustrated in FIG. 8 is obtained. As a result of the second photolithographic process and the associated re-oxidization of the silicon dioxide layer 2, the original adjustment mark 11 has been expanded in comparison to its original form to a different adjustment mark 21 which consists of two crosses arranged one within the other. The edges or flanks 14 of the enlarged mark 21 will be visible in vertical light and can be used for a subsequent adjustment step. If a third exposure mask were to be adjusted relative to the adjustment mark 21, the third exposure mask would, however, have to possess considerably greater dimensions for the adjustment mark than the adjustment mark 17 of the second mask 41 in accordance with the prior art method. Thus, the prior art method as described hereinabove develops a sequence for the use of each of the first, second and third mask which sequence is fixed.

In order to avoid fixing the use of each mask to be in a given sequence, the present invention involves the improvement of providing the first mask 4 with an adjustment structure 110 (FIG. 9a and FIG. 10a). The adjustment structure 110 will be reproduced on the substrate 1 and has a pair of adjustment marks for each of the subsequently used exposure masks such as 120, 130, 140, 150 or 230. If four additional exposure masks are to be adjusted relative to the substrate 1 following the production of the adjustment structure 110, the structure 110 will have two rows 111 and 112 with each row containing four separately spaced adjustment crosses with the crosses 101, 102, 103 and 104 being in the row 111 and the crosses 105, 106, 107 and 108 being in the row 112. As illustrated, the crosses of the first row 111 have a somewhat greater dimensional width than the crosses of the second row 112.

A second mask 120, which is to be adjusted relative to the adjusting structure 110 which has been produced in this manner, will likewise possess a pair of adjusting crosses 121 and 125 which, for example, consists of dark bars or a dark cross on a transparent background. The adjustment consists of adjusting the cross 121 relative to the cross 101 on the substrate wafer.

Following the completion of the photolithographic step which was carried out using the second photo mask 120, a photo lacquer is again applied on the substrate wafer and a third mask 130 (FIG. 9c) is adjusted relative to the substrate wafer. The third photo mask likewise possesses two adjusting crosses 132 and 136 which are offset spatially from the position of the adjustment crosses 121 and 125 of the second mask 120 and also are illustrated as being light impervious crosses on a transparent background. As with the previous embodiment, the cross 132 has smaller dimensions than the cross 136. When adjusting the mask 130 on the substrate, the smaller cross 132 is adjusted and aligned to coincide with the adjusting cross 102 of the second pair of adjustment marks on the substrate wafer.

Following the completion of the photolithographic step linked with the third exposure mask 130, the remainder of production processes includes a photolithographic process using a fourth photo mask 140 (FIG. 9d) and another photolithographic process using the fifth exposure mask 150 (FIG. 9e). In each case the marks 143 and 147 of the fourth mask 140 are aligned with one of the adjustment marks 103, 107, and the marks 154 and 158 of the fifth mask are aligned with the marks 104 and 108.

As illustrated in FIGS. 9a through 9e, each of the masks can be exchanged with respect to another as far as the sequence of photolithographic process steps are concerned. This is due to the fact that the adjustment marks such as 101, 105 on the substrate are only utilized with the adjustment marks 121 and 125 of the second mask 120. Thus, each pair of adjustment marks on the substrate is only used for its respective single mask.

As illustrated in FIG. 10, it is also possible to utilize a mask 230, which has a complementary adjustment structure of marks 232, 236, in place of the mask 130. The mask 230 has adjustment crosses 232 and 236 which are transparent crosses or marks on a light impervious background. In order to align the mask 230 on the substrate, the adjustment mark formed by the transparent cross 236 is aligned to coincide with the mark 106 whose dimensions are slightly less and, therefore, can be observed through the transparent mark 236.

On account of the selected adjustment structures which are also illustrated in FIGS. 10a-10e, it is possible to transfer copy each of the photo masks to produce a complementary photo mask. The complementary photo mask obtained in this way can be used in the process with the adjustment being carried out in the same fashion as with the original mask.

In the embodiment illustrated in FIGS. 9a and 10a, each of the marks such as 101, 102, 103 and 104 in the first line 111 will be larger in dimension than the marks 105-108 in the second line 112. For example, they will have a dimension or bar width 15 μm and are disposed on a square which is 100 μm on a side or edge. The marks such as 105-108 in the second line 112 will have a bar width or dimension of 10 μm and are positioned also on squares that are 100 μm on a side. Each of the pairs of marks in the four masks 120, 130, 140 and 150 will have the marks 121, 132, 143, 154 which are associated with the marks in the first row of the substructure and are provided with a bar width or dimension of 10 μm and as illustrated are solid or light impervious marks disposed on a transparent background having a square configuration of 100 μm on a side. The adjustment marks 125, 136, 147 and 158 will be utilized with the marks in the second row and have a bar width of 15 μm and are illustrated as light impervious marks disposed on a transparent background having a square dimension of 100 μm on a side. The mask 230 of FIG. 10c, has transparent crosses disposed on light impervious backgrounds that are square with 100 μm per side. The mark 232 will have a bar width of approximately 10 μm while the mark 236 will have a bar width of approximately 15 μm.

Although various minor modifications may be suggested by those versed in the art, it should be understood that I wish to embody within the scope of the patent warranted hereon, all such modifications as reasonably and properly come within the scope of my contribution to the art.

I claim:

1. In a method for adjusting individual exposure masks relative to a substrate during consecutively performed photolithographic processes wherein the substrate is provided with an adjustment structure by means of a photolithographic step employing a first mask and the method includes at least two additional photolithographic processes being consecutively performed on the substrate with each process including adjusting an exposure mask on the substrate by aligning adjustment structure on the mask to coincide with the adjustment structure of the substrate, said process causing the dimension of the adjustment structure of the mask to be reproduced on the adjustment structure of the substrate, the improvements comprising providing an adjustment structure for the substrate having a separate pair of adjustment marks for each of the exposure masks so that the number of pairs at least equals the number of exposure masks, providing each of the exposure masks with a single pair of adjustment marks comprising a first and second mark, said pair on one exposure mask being spatially arranged with respect to the pairs on the other exposure masks so that when each of the exposure masks are aligned on the substrate, the pair of adjustment marks of each mask is aligned to coincide with a different pair of marks on the substrate.

2. In a method according to claim 1, wherein said pairs of adjustment marks on said substrate are aligned in a row with a first row having one mark of each pair and a second row being parallel thereto and having the second mark of each pair, said marks of the first row having a shape which is geometrically similar to the adjustment marks of the second row but larger than said marks of the second row, wherein the step of providing a pair of first and second marks on each of the exposure masks provides the first mark with a shape similar to one of the adjustment marks of the first row on the substrate and the second mark is similar in shape to one of the adjustment marks of the second row of the substrate, and wherein the first adjustment mark of each pair on the exposure mask possesses the dimensions of the adjustment mark of the second row of the adjustment structure on the substrate and the second adjustment mark on the exposure mask possesses a dimension of the adjustment mark of the first row of the substrate.

3. In a method according to claim 2, wherein the step of providing the adjustment marks provides marks having a configuration of a cross.

4. In a method according to claim 3, wherein the adjustment structure of the substrate consists of said first row composed of crosses having a bar width of 15 μm disposed in a square of 100 μm on an edge and the second row of marks consists of crosses having a bar width of 10 μm disposed in a square of 100 μm on an edge.

5. In a process according to claim 4, wherein the marks of the exposure mask have a first adjustment mark consisting of a dark cross having a bar width of approximately 10 μm disposed in a transparent square of approximately 100 μm per side and the second adjustment mark consists of a dark cross having a bar width of 15 μm centered in a transparent square of approximately 100 μm per side.

6. In a process according to claim 4, wherein the adjustment marks of an exposure mask comprise a first adjustment mark consisting of a transparent cross having a bar width of approximately 10 μm disposed in a light impermeable square of approximately 100 μm per side and the second adjustment mark of the pair consists of a light transmitting cross having a bar width of approximately 15 μm in an impermeable square of approximately 100 μm per side.

* * * * *